(12) United States Patent
Watanabe

(10) Patent No.: US 9,112,468 B2
(45) Date of Patent: Aug. 18, 2015

(54) AUDIO DEVICE WITH MUTE FUNCTION

(71) Applicant: TEAC Corporation, Tama-shi, Tokyo (JP)

(72) Inventor: Kazuo Watanabe, Iruma (JP)

(73) Assignee: TEAC Corporation, Tama-shi, Tokyo (JP)

( * ) Notice: Subject to any disclaimer, the term of this patent is extended or adjusted under 35 U.S.C. 154(b) by 408 days.

(21) Appl. No.: 13/750,726

(22) Filed: Jan. 25, 2013

(65) Prior Publication Data

US 2014/0029765 A1 Jan. 30, 2014

(30) Foreign Application Priority Data

Jul. 24, 2012 (JP) ................. 2012-164086

(51) Int. Cl.
  *H03G 3/00* (2006.01)
  *H03G 3/20* (2006.01)
  *H04R 3/00* (2006.01)
  *H04R 29/00* (2006.01)
  *H04R 1/10* (2006.01)

(52) U.S. Cl.
  CPC ............ *H03G 3/20* (2013.01); *H04R 3/007* (2013.01); *H04R 29/001* (2013.01); *H04R 1/1041* (2013.01); *H04R 2420/03* (2013.01); *H04R 2420/09* (2013.01); *H04R 2430/01* (2013.01)

(58) Field of Classification Search
  CPC ........... H03G 3/20; H03G 3/348; H04R 5/04; H04R 2420/07; H04R 1/1041; H04R 5/033; H04N 21/4396
  USPC ............. 381/72, 74, 94.5, 102–107; 455/559
  See application file for complete search history.

(56) References Cited

U.S. PATENT DOCUMENTS

2005/0111675 A1 5/2005 Lee

FOREIGN PATENT DOCUMENTS

| JP | 11136789 A | | 5/1999 |
| JP | 2002010389 A | * | 1/2002 |

OTHER PUBLICATIONS

Extended European Search Report dated Jan. 12, 2015, for corresponding EP Application No. 13164166.4-1901 / 2690884, 5 pages.

* cited by examiner

*Primary Examiner* — Vivian Chin
*Assistant Examiner* — Ammar Hamid
(74) *Attorney, Agent, or Firm* — Seed IP Law Group PLLC

(57) ABSTRACT

An audio device prevents an excessive volume output in a case such as when a set of headphones is replaced or a power supply is turned ON from OFF. A mute control circuit includes a switch that detects insertion of a headphone plug and a switch that detects a volume position. When no insertion of a headphone plug is detected, a mute mode is activated to output no audio signals. When insertion of a headphone plug is detected and it is not detected that the volume position is set at a mute position or near to the mute position, the mute mode is maintained, while when it is detected that the volume position is set at the mute position or near to the mute position, the mute mode is canceled.

9 Claims, 4 Drawing Sheets

AUDIO DEVICE WITH MUTE FUNCTION

PRIORITY INFORMATION

This application claims priority to Japanese Patent Application No. 2012-164086, filed on Jul. 24, 2012, which is incorporated herein by reference in its entirety.

BACKGROUND

1. Technical Field

The present invention relates to an audio device and in particular, to a mute function.

2. Related Art

Conventionally, audio devices provided with a headphone output are designed to activate a mute function at the time of power ON/OFF so as not to output a click noise. Further, another function is also suggested to limit an output level so as not to provide an excessive volume output when a headphone plug is inserted into a jack.

JP 11-136789 A describes that an audio output is automatically set to mute or low level in response to pulling out of a headphone plug. The volume is automatically set to zero when a headphone plug is pulled out. The volume should be manually adjusted from the volume zero, when a headphone plug is inserted.

JP 2002-010389 A describes that an audio level is automatically set to mute in response to pulling out of a headphone plug, and then the audio level is automatically returned to a normal level. After the audio level is set to mute, the mute position is maintained until a user adjusts a volume setting.

It should be noted that depending on an impedance or efficiency of respective headphones, actual output levels to the same source output may differ significantly among headphones. Therefore, when headphones are changed with a volume setting left at a high output level, there is a risk that an output will be set at an excessive volume. With JP 11-136789 A, it is possible to prevent an excessive volume by automatically setting an electrical volume to zero (by electrically setting a signal output level to zero) at the time of pulling out of a headphone plug. However, a problem still remains for analog volume. Further, because JP 11-136789 A nowhere provides a specific description about a mute control at the time of power ON/OFF, an excessive volume output is still possible when the power supply is turned from OFF to ON with a headphone plug inserted, depending on a volume setting level.

On the other hand, in JP 2002-010389 A, because a mute mode is maintained until a volume setting is adjusted, there is a problem that an audio output cannot be confirmed until the volume setting is completed. Further, there is another problem that, if a volume setting is erroneously adjusted, an output may be made at an excessive volume when the mute mode is canceled.

The above described problems may occur not only when changing headphones but also when changing an input source.

SUMMARY

The present invention provides an audio device that can prevent excessive volume output at the time of changing headphones or changing an input source, as well as at the time of turning power from OFF to ON.

An audio device with a mute function according to the present invention comprises a first detection unit that detects insertion of a headphone plug; a second detection unit that detects a volume position; and a control unit that controls a mute mode when a power supply is ON such that when the first detection unit detects no insertion of the headphone plug, the mute mode is activated so as not to output an audio signal; when the first detection unit detects the insertion of the headphone plug and the second detection unit does not detect that the volume position is set at a mute position or near to the mute position, the mute mode is maintained; and when the first detection unit detects the insertion of the headphone plug and the second detection unit detects that the volume position is set at the mute position or near to the mute position, the mute mode is canceled.

Further, another audio device with a mute function according to the present invention comprises a first detection unit that detects an input source change; a second detection unit that detects a volume position; and a control unit that controls a mute mode when a power supply is ON such that when the first detection unit detects the input source change, the mute mode is activated so as not to output an audio signal; when the first detection unit detects no input source change and the second detection unit does not detect that the volume position is set at a mute position or near to the mute position, the mute mode is maintained; and when the first detection unit detects no input source change and the second detection unit detects that the volume position is set at the mute position or near to the mute position, the mute mode is canceled.

Further, yet another audio device with a mute function according to the present invention comprises a first detection unit that detects insertion or pulling out of a headphone plug; a second detection unit that detects a volume position; and a control unit that controls a mute mode when a power supply is ON such that when the first detection unit detects no insertion or pulling out of the headphone plug, the mute mode is activated so as not to output an audio signal; when the first detection unit detects the insertion or pulling out of the headphone plug and the second detection unit does not detect that the volume position is set at a mute position or near to the mute position, the mute mode is maintained; and when the first detection unit detects the insertion or pulling out of the headphone plug and the second detection unit detects that the volume position is set at the mute position or near to the mute position, the mute mode is canceled.

According to the present invention, when a headphone is changed or an input source is changed, a setting is once changed to a mute mode at the time of insertion or pulling out of a headphone plug or changing of an input source, such that the mute mode is maintained unless the volume position is set to a mute position or near to the mute position. Because the mute mode is canceled to enable an audio output only when the volume position is set to a mute position or near to the mute position, it is possible to reliably prevent an audio output at an unintentional excessive volume.

BRIEF DESCRIPTION OF THE DRAWINGS

Preferred embodiment(s) of the present invention will be described in detail based on the following figures, wherein.

DETAILED DESCRIPTION

Figure 1:
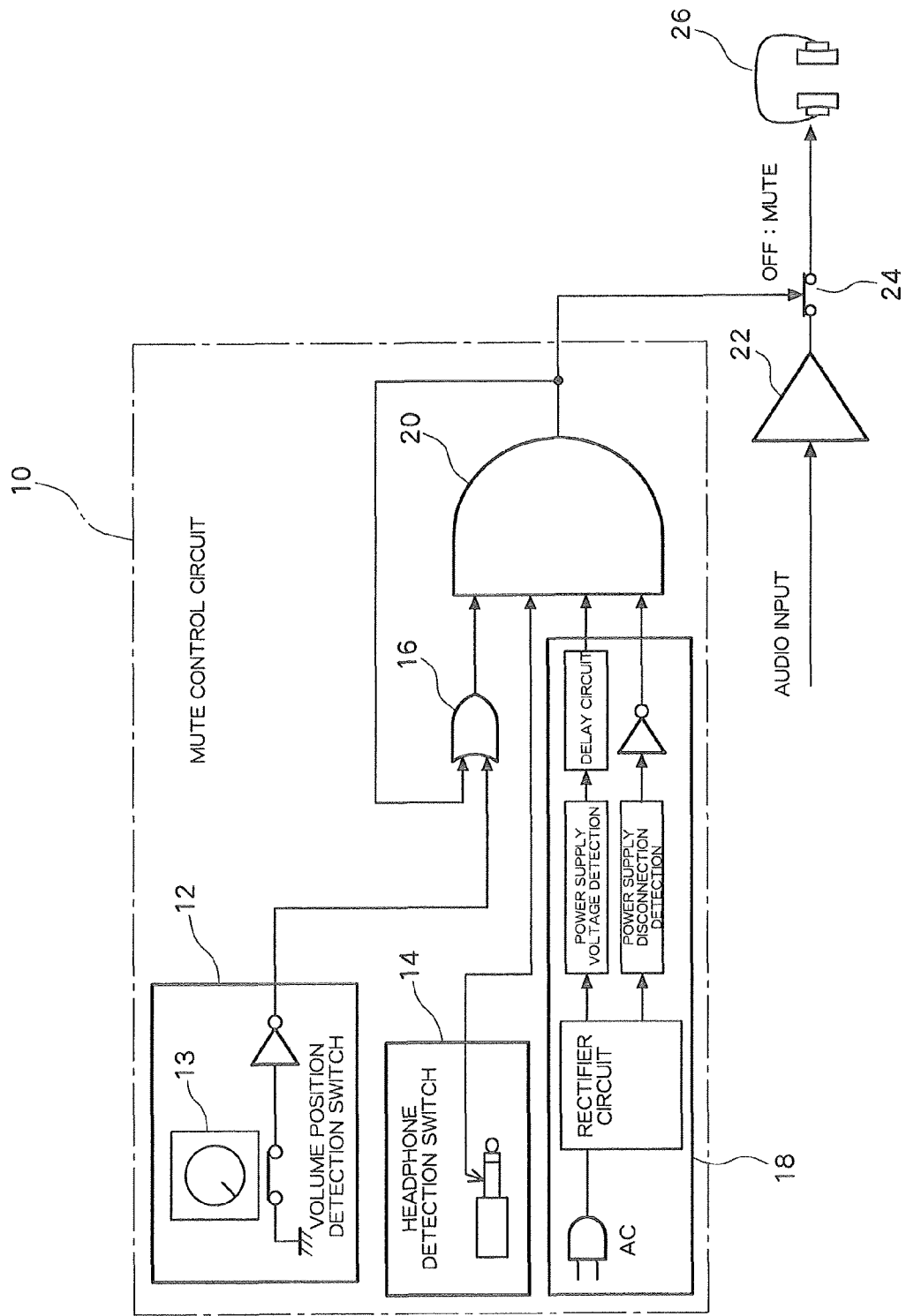
FIG. 1 is a circuit configuration diagram according to one embodiment of the present invention.

Embodiments according to the present invention are described below by referring to the drawings.

FIG. 1 shows a circuit configuration of an audio device according to an embodiment of the present invention.

The audio device is provided with a mute control circuit 10 which controls ON and OFF of a mute mode.

The mute control circuit 10 is provided with a volume position detection switch 12 which detects a volume position of an analog volume 13; a headphone detection switch 14 which detects insertion of a headphone plug into a headphone jack; an OR gate 16; an AND gate 20; and a power supply circuit 18. An output of the mute control circuit 10, which means an output of the AND gate 20, is supplied to a mute switch 24 which controls ON and OFF of the mute mode.

The mute switch 24 switches between whether to connect an output of an amplifier 22 which amplifies audio signals (mute OFF indicating that the mute mode is canceled) or to disconnect the output of the amplifier 22 (mute ON). When the mute switch 24 is ON, the mute mode is canceled causing audio signals to be output to a headphone 26. When the mute switch 24 is OFF, the mute mode is activated causing no audio signals to be output to the headphone 26.

The volume position detection switch 12 detects a position of the analog volume 13. More specifically, the volume position detection switch 12 detects that the position of the analog volume 13 is at the "−∞" position (mute mode). When the position of the analog volume 13 is at the "−∞" position, the volume position detection switch 12 is turned OFF causing a HIGH signal to be output after being inverted by an inverter. When the position of the analog volume 13 is at a position other than the "−∞" position, the volume position detection switch 12 is turned ON such that a low signal is output after being inverted by the inverter. A detection signal from the volume position detection switch 12 is supplied to the OR gate 16.

The headphone detection switch 14 detects insertion of a headphone plug into a jack. When a headphone plug is inserted, the headphone detection switch 14 outputs a HIGH signal. Otherwise, the headphone detection switch 14 outputs a LOW signal. A detection signal from the headphone detection switch 14 is supplied to the AND gate 20.

To one terminal of the OR gate 16, the detection signal from the volume position detection switch 12 is supplied, while to the other terminal, an output signal from the AND gate 20 is supplied. The OR gate 16 calculates a logical sum of these two input signals and outputs the obtained logical sum to the AND gate 20.

The power supply circuit 18 is provided with an AC plug, a rectifier circuit, a power supply voltage detection circuit, a delay circuit, a power supply disconnection detection circuit, and an inverter.

The power supply voltage detection circuit and the delay circuit function in such a manner that in response to a detection of turning ON of the power supply, a HIGH signal is output after waiting for a certain period of time predetermined as a delay time until the circuit reaches a steady state. Further, the power supply disconnection detection circuit and the inverter function in such a manner that in response to a detection of OFF of the power supply, a LOW signal is output. In other words, a HIGH signal is output when it is detected that the power supply is not OFF. Two signals from the power supply circuit 18 (a detection signal indicating that the power supply is turned ON and a detection signal indicating that the power supply is not turned OFF) are supplied to the AND gate 20.

The AND gate 20 calculates a logical product of four outputs, which are an output from the OR gate 16, an output from the headphone detection switch 14, and two outputs from the power supply circuit 18, and controls ON and OFF of the mute mode by supplying the obtained logical product to the mute switch 24. The output of the AND gate 20 becomes HIGH when all of the outputs from the OR gate 16, the headphone detection switch 14, and the power supply circuit 18 are HIGH and thereby the mute switch 24 is turned ON to cancel the mute mode. On the other hand, the output of the AND gate 20 becomes LOW when any one of the outputs from the OR gate 16, the headphone detection switch 14, and the power supply circuit 18 is LOW and thereby the mute switch 24 is turned OFF to activate the mute mode.

Further, as described above, the output from the AND gate 20 is also supplied to the other terminal of the OR gate 16. Therefore, when the output from the AND gate 20 becomes HIGH, a HIGH signal is output from the OR gate 16 even when the detection signal from the volume position detection switch 12 is LOW. This state is maintained until the output from the AND gate 20 becomes LOW.

Operation of the mute control circuit 10 in the present embodiment with a configuration such as described above is described below for specific cases.

CASE (1) when a Power Supply is OFF.

When the power supply is OFF, because a signal from the power supply circuit 18 is a LOW signal, the output from the AND gate 20 becomes low and thereby the mute switch 24 is OFF to maintain the mute mode (because OFF of the power supply indicates no power, all of the outputs can be assumed to be LOW).

CASE (2) when a Power Supply is ON and a Headphone Plug is not Inserted into a Jack.

When the power supply is turned ON, a HIGH signal is output from the power supply circuit 18 after a certain delay time. However, because a headphone plug is not inserted into a jack, a LOW signal is output from the headphone detection switch 14. Therefore, the output from the AND gate 20 is LOW and thereby the mute switch 24 is OFF to maintain the mute mode.

CASE (3) when a Power Supply is ON and a Headphone Plug is Inserted into a Jack.

When the power supply is turned ON and a headphone plug is inserted into a jack, the headphone detection switch 14 outputs a HIGH signal (the output signal is changed from LOW to HIGH). Therefore, ON or OFF of the mute mode is determined in accordance with a signal from the volume position detection switch 12.

That is, when the analog volume 13 is at a position other than the "−∞" position, for example, when the analog volume 13 is at a certain level (any level other than the "−∞" position), a low signal is output from the volume position detection switch 12 and thereby the output from the AND gate 20 is LOW. Therefore, even when a headphone plug is inserted into a jack, the mute switch 24 is OFF to maintain the mute mode.

On the other hand, when the analog volume 13 is at the "−∞" position, because a HIGH signal is output from the volume position detection switch 12, the output from the AND gate 20 is HIGH and thereby the mute switch 24 is turned ON to cancel the mute mode. However, even with the mute mode canceled, because the analog volume 13 is at the "−∞" position, an audio signal is not immediately output under this condition. When a user increases the volume setting to a certain level by adjusting the analog volume 13 from this condition, a LOW signal is output from the volume position detection switch 12, but because a HIGH signal output from the AND gate 20 is supplied to the other terminal of the OR gate 16, the output from the OR gate 16 is maintained HIGH. Therefore, the output from the AND gate 20 is also maintained HIGH. Because the mute mode is remained canceled with the mute switch 24 being ON, the audio signal at a level set by the analog volume 13 is output from the headphone 26.

Figure 2:
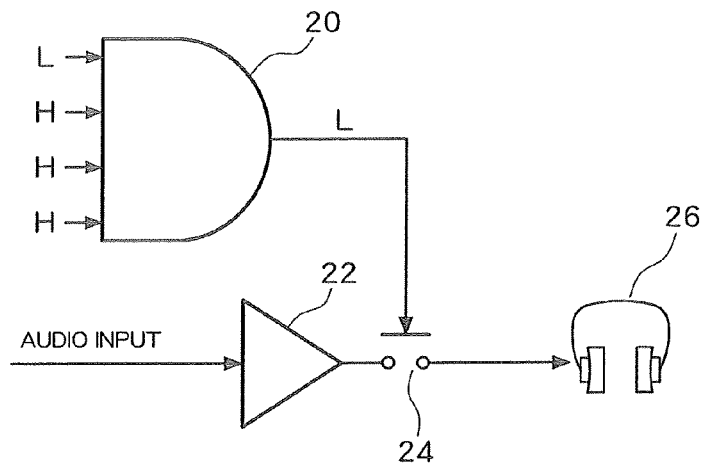
FIG. 2 is an explanatory drawing to show a state of a mute switch and peripherals according to the embodiment of the present invention when a headphone plug is inserted with a volume position set to other than the "−∞" position (mute position)
Figure 3:
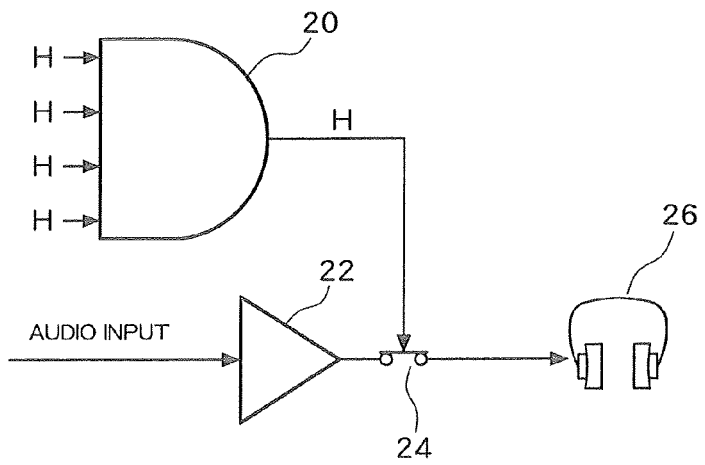
FIG. 3 is an explanatory drawing to show a state of the mute switch and peripherals according to the embodiment of the present invention when a headphone plug is inserted with a volume set to the "−∞" position (mute position)

FIGS. 2 and 3 shows an input/output state of the AND gate 20 and a state of the mute switch 24 when the power supply is ON and a headphone plug is inserted into a jack.

FIG. 2 shows a state when the analog volume 13 is set at a position other than the "−∞" position. Because, among the inputs supplied to the AND gate 20, the signal from the volume position detection switch 12 is a LOW signal (indicated by "L" in the drawing), the output from the AND gate 20 becomes LOW causing the mute switch 24 to be turned OFF to activate the mute mode. Therefore, even when the analog volume 13 is set to a certain level, no audio signals are output.

FIG. 3 shows a state when a user has turned the analog volume 13 to the "−∞" position. Because, among the inputs supplied to the AND gate 20, the signal from the volume position detection switch 12 becomes also a HIGH signal (indicated by "H" in the drawing), the output from the AND gate 20 becomes HIGH causing the mute switch 24 to be turned ON to cancel the mute mode. Therefore, if a user turns the analog volume 13 to a certain level from such a condition, an audio signal amplified to that level is output.

CASE (4) when a Power Supply is ON and a Headphone Plug is Pulled Out from a Jack and then Inserted Again to Change a Headphone.

When a headphone plug is pulled out from a jack, a LOW signal is output from the headphone detection switch 14 and thereby the output from the AND gate 20 becomes LOW causing the mute switch 24 to turned OFF to activate the mute mode.

Figure 4:
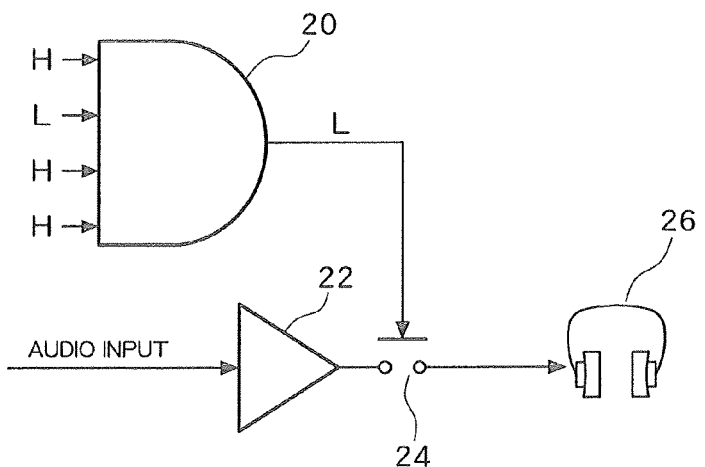
FIG. 4 is an explanatory drawing to show a state of the mute switch and peripherals according to the embodiment of the present invention when a headphone plug is pulled out.

FIG. 4 shows an input/output state of the AND gate 20 and a state of the mute switch 24 in this case. Because, among the inputs supplied to the AND gate 20, the signal from the headphone detection switch 14 is a low signal (indicatedby "L" in the drawing), the output from the AND gate 20 becomes LOW causing the mute switch 24 to be turned OFF to activate the mute mode. Therefore, no audio signals are output even when the analog volume 13 is set at a certain level.

When a headphone plug is inserted again, a HIGH signal is output from the headphone detection switch 14. Therefore, the ON and OFF of the mute mode is determined in accordance with the signal from the volume position detection switch 12 as in the above CASE (2).

That is, because a LOW signal is output from the volume position detection switch 12 when the analog volume 13 is at a position other than the "−∞" position, the output from the AND gate 20 becomes LOW. Therefore, even if a headphone plug is inserted, the mute switch 24 is OFF to maintain the mute mode (refer to FIG. 2). Therefore, even if the impedances are different between the previous headphone 26 and the newly-inserted headphone 26, an output at an excessive volume can be effectively prevented.

On the other hand, when the analog volume 13 is at the "−∞" position, because a HIGH signal is output from the volume position detection switch 12, the output from the AND gate 20 becomes HIGH causing the mute switch 24 to be turned ON to cancel the mute mode. When a user increases the volume setting to a certain level by adjusting the analog volume 13, an audio signal at a level set by the analog volume 13 is output from the headphone 26 (refer to FIG. 3).

As described above, in the present embodiment, after a power supply of an audio device is turned ON, the mute mode is maintained until a certain period of time (delay time applied by the delay circuit) has passed. Although it becomes possible to cancel the mute mode after this period, because the mute mode continues to be maintained unless the headphone plug 26 is inserted into the jack and the analog volume 13 is set at the "−∞" position, an output at an unexpected excessive volume which would be caused by setting the analog volume 13 at a certain level can be prevented at the time of turning the power supply ON.

Further, when replacing the headphones 26 with another headphone 26 with a different impedance, because the mute mode is automatically activated when the headphone plug 26 is pulled out and the mute mode is maintained until the analog volume 13 is set at the "−∞" position, it is possible, even when another headphone plug 26 is inserted, to prevent an excessive volume output due to the different impedance.

It should be noted that among users who are very familiar with audio devices, it is a common practice to turn the analog volume 13 to the "−∞" position to set the mute mode before pulling out a headphone plug 26 and inserting another headphone plug 26, and then turn the analog volume 13 from the "−∞" position to a desired position to obtain a desired level output. The mute control circuit 10 according to the present embodiment accords with such operations. That is, because such users turn the analog volume 13 from the "−∞" position to a desired position to obtain a desired level output when replacing the headphones 26 and the mute mode is canceled at this time, the users would feel no sense of discomfort and enjoy audio quality or the like using another set of headphones 26.

Naturally, also for those who are not very familiar with audio devices, excessive volume can be reliably prevented because the mute mode is maintained even with the analog volume 13 left at a certain level when replacing the headphones 26.

The present embodiment is particularly advantageous in an environment where an unspecified large number of users can try listening and viewing using various headphones.

In the present embodiment, it is also possible to make ON and OFF of the mute mode visually recognizable by supplying the output from the AND gate 20 to an LED. For example, it is possible to notify that the mute mode is activated by turning ON a mute LED when the output of the AND gate 20 is LOW. When a user replaces a set of headphones 26 with another set of headphones 26 while leaving the setting of the analog volume 13 at a certain level, the mute LED is turned ON notifying the user that the mute mode is activated. When the user turns the analog volume 13 to the "−∞" position, the mute LED is turned OFF to notify the user that audio output is possible.

Embodiments according to the present invention are described above. However, the present invention is not limited to the embodiments and various changes are possible.

For example, in the above embodiments, the mute mode is canceled when the analog volume 13 is set to the "−∞" position. However, the position is not necessarily at the exact "−∞" position. The mute mode may be canceled when the analog volume 13 is set near the "−∞" position. Alternatively, the mute mode may be canceled when it is detected that the analog volume 13 is intentionally turned at least toward the "−∞" position or near the "−∞" position. In other words, the mute mode may be canceled by using, as a trigger, an operation to set the analog volume level to low to such an extent that the output would not be at an excessive volume even when the impedances or efficiencies of headphones 26 are different from each other.

Further, although the above embodiments describe the mute mode in particular when replacing the headphones 26, the embodiments can be similarly applied for replacing an input source, for example, from CD to PC. In this case, an input source change detection switch may be used in place of the headphone detection switch 14.

Figure 5:
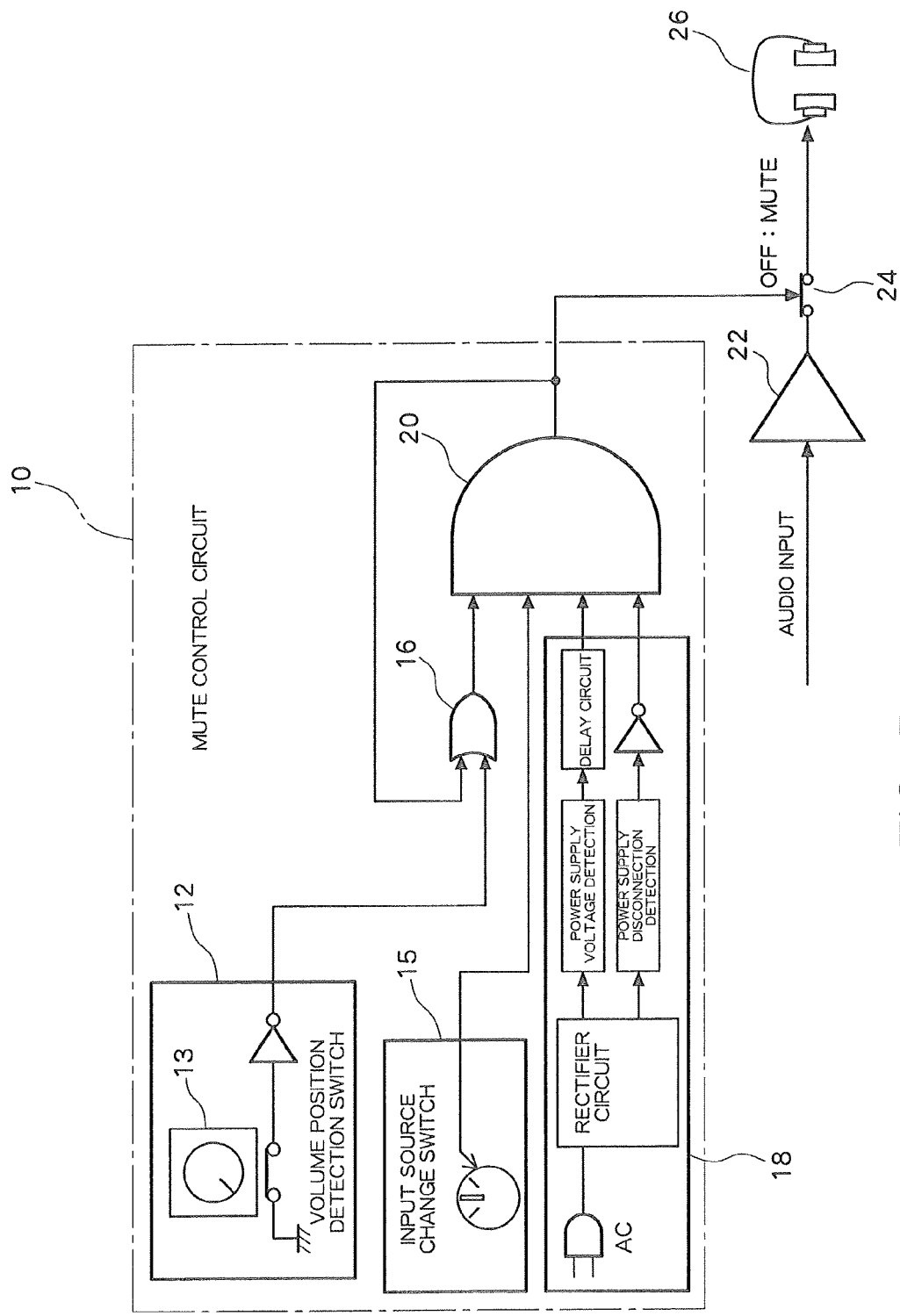
FIG. 5 is a circuit configuration diagram according to another embodiment of the present invention.

FIG. 5 shows a configuration in this case. An input source change detection switch 15 operates in response to a change of an input source such that the input source change detection switch 15 outputs a LOW signal to the AND gate 20 at a time when the input source is changed. Otherwise, the input source change detection switch 15 outputs a HIGH signal to the AND gate 20. Because a signal from the input source change detection switch 15 temporarily becomes LOW signals when an input source is changed, the output from the AND gate 20 becomes LOW causing the mute switch 24 to be turned OFF to activate the mute mode. After that (after the input source is changed to a new source but a change is not detected afterwards), the mute mode is maintained because the signal from the volume position detection switch 12 remains LOW unless the analog volume 13 is set at the "−∞" position or near the "−∞" position. This makes it possible, even if the input source is changed with the analog volume 13 set at a certain level (any level other than the "−∞" position or near the "−∞" position), to prevent an excessive volume output. Needless to say, the mute mode may be used both for replacing headphones and changing an input source.

Figure 6:
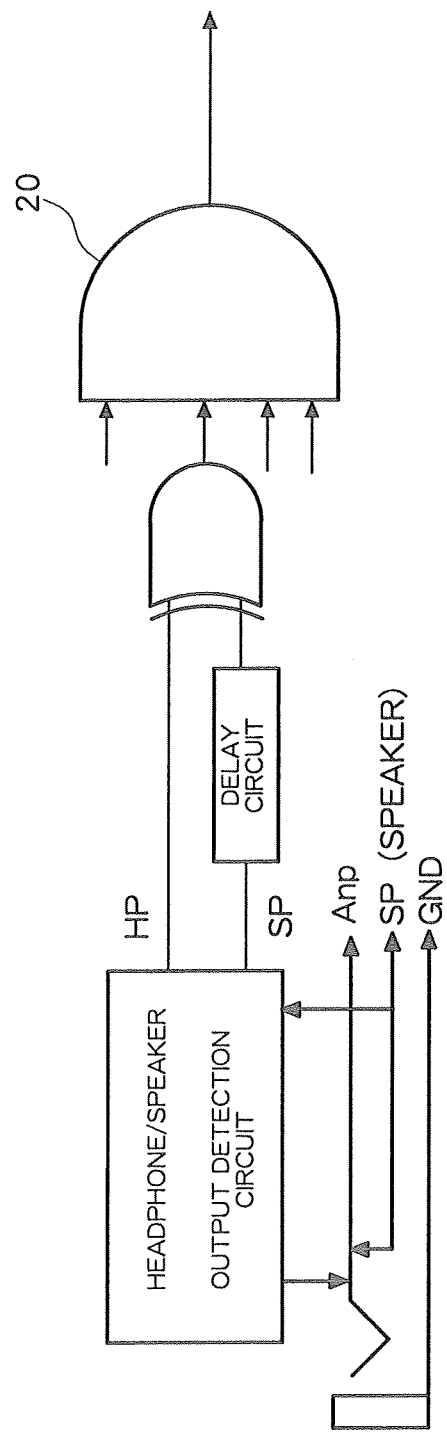
FIG. 6 is a circuit configuration diagram according to yet another embodiment of the present invention.

Further, the above embodiments are described by assuming use with a headphone amplifier. However, the present invention may also be applied to an amplifier with a speaker output. In the case of an amplifier with a speaker output, in a circuit shown in FIG. 1, because when a headphone plug is pulled out from a jack, the headphone detection switch 14 keeps outputting a LOW signal, the mute mode is not canceled even when the analog volume 13 is set at the "−∞" position or near the "−∞" position and thereby no audio is output from the speaker. Therefore, as shown in FIG. 6, a headphone output detection signal is supplied to, for example, one of the input terminals of an EXOR gate (exclusive OR circuit), while a speaker output detection signal is connected to the other input terminal of the EXOR gate via the delay circuit. The output signal from the EXOR gate is connected to the input terminal of the AND gate 20. Because, when a headphone plug is inserted into a jack, the headphone output detection signal is HIGH, and the speaker output detection signal is LOW, the output from the EXOR gate becomes HIGH. When a headphone plug is pulled out from a jack under such circumstances, the headphone output detection signal becomes LOW and the speaker output detection signal becomes HIGH. However, because the input of the HIGH signal which is the speaker output detection signal is delayed by the delay circuit, both inputs to the EXOR gate become LOW during the delay time applied by the delay circuit. Therefore, the output from the EXOR gate temporality becomes LOW, and thereby the output from the AND gate 20 can be made LOW. Because, after the delay time, the speaker output detection signal which is input to the EXOR gate becomes HIGH and thereby the output from the EXOR gate becomes HIGH, it becomes possible to control ON and OFF of the mute mode by a signal from the volume position detection switch 12. The same operations are applicable when a headphone plug is inserted into a jack. More specifically, because when a headphone plug is pulled out from a jack, the headphone output detection signal is LOW and the speaker output detection signal is HIGH, the output of the EXOR gate becomes HIGH. When a headphone plug is inserted into the jack under these circumstances, the headphone output detection signal becomes HIGH and the speaker output detection signal becomes LOW. However, because input of the LOW signal which is the speaker output detection signal is delayed by the delay circuit, both inputs to the EXOR gate become HIGH during the delay time applied by the delay circuit. Therefore, during the delay time, the output from the EXOR gate temporality becomes low and the output from the AND gate 20 can be made LOW. After the delay time, the speaker output detection signal which is input to the EXOR gate becomes LOW and the output from the EXOR gate becomes HIGH. Therefore, it becomes possible to control ON and OFF of the mute mode with the signal from the volume position detection switch 12.

It should be noted that the delay circuit may be provided not on the supply line side of the speaker output detection signal but on the supply line side of the headphone output detection signal.

Further, it is also possible to detect a change in the speaker output detection signal and/or the headphone output detection signal and to supply a one-shot pulse signal at a LOW level to an input terminal of the AND gate 20 using a mono multivibrator or the like.

Further, although a mute control is realized by the circuit configuration shown in FIG. 1 or FIG. 5 in the above embodiments, it is also possible to realize, by a microcomputer, the detection and the mute control realized by the various switches.

What is claimed is:

1. An audio device with a mute function, comprising: a first detection unit that detects insertion of a headphone plug; a second detection unit that detects a volume position;
    and a control unit that controls a mute mode when a power supply is ON such that when the first detection unit detects no insertion of the headphone plug, the mute mode is activated so as not to output an audio signal, when the first detection unit detects the insertion of the headphone plug and the second detection unit does not detect that the volume position is set at a mute position, the mute mode is maintained, and when the first detection unit detects the insertion of the headphone plug and the second detection unit detects that the volume position is set at the mute position, the mute mode is canceled.

2. The device according to claim 1 wherein the control unit comprises a logic gate that
    receives inputs of
        a binary detection signal from the first detection unit in accordance with whether or not the headphone plug is inserted;
        a binary detection signal from the second detection unit in accordance with the volume position; and
        a binary detection signal from a power supply circuit in accordance with whether the power supply is ON or OFF, and
    generates and outputs a control signal to switch between a mute mode activation and a mute mode cancellation based on a logical operation.

3. The device according to claim 1 wherein the control unit comprises:
   a first logic gate to which a HIGH/LOW binary detection signal is input from the second detection unit in accordance with whether or not the volume position is set at the mute position or near the mute position, and
   a second logic gate that
      receives inputs of an output signal from the first logic gate; a HIGH/LOW binary detection signal from the first detection unit in accordance with whether or not the headphone plug is inserted; a HIGH/LOW binary detection signal from a power supply circuit in accordance with whether the power supply is ON or OFF,
      generates and outputs a HIGH/LOW binary control signal indicating whether a mute mode is to be activated or canceled based on a logical operation, and
      supplies a portion of the generated output to the first logic gate as an input signal.

4. An audio device with a mute function, comprising: a first detection unit that detects an input source change; a second detection unit that detects a volume position; and a control unit that controls a mute mode when a power supply is ON such that when the first detection unit detects the input source change, the mute mode is activated so as not to output an audio signal, when the first detection unit detects no input source change and the second detection unit does not detect that the volume position is set at a mute position, the mute mode is maintained, and when the first detection unit detects no input source change and the second detection unit detects that the volume position is set at the mute position, the mute mode is canceled.

5. The device according to claim 4 wherein the control unit comprises a logic gate that
   receives inputs of
      a binary detection signal from the first detection unit in accordance with whether or not the input source is changed;
      a binary detection signal from the second detection unit in accordance with the volume position; and
      a binary detection signal from a power supply circuit in accordance with whether the power supply is ON or OFF, and
   generates and outputs a control signal to switch between a mute mode activation and a mute mode cancellation based on a logical operation.

6. The device according to claim 4 wherein the control unit comprises:
   a first logic gate to which a HIGH/LOW binary detection signal is input from the second detection unit in accordance with whether or not the volume position is set at the mute position or near the mute position, and
   a second logic gate that
      receives inputs of an output signal from the first logic gate; a HIGH/LOW binary detection signal from the first detection unit in accordance with whether or not the input source is changed; a HIGH/LOW binary detection signal from a power supply circuit in accordance with whether the power supply is ON or OFF,
      generates and outputs a HIGH/LOW binary control signal indicating whether a mute mode is to be activated or canceled based on a logical operation, and
      supplies a portion of the generated output to the first logic gate as an input signal.

7. An audio device with a mute function, comprising: a first detection unit that detects insertion or pulling out of a headphone plug; a second detection unit that detects a volume position; and a control unit that controls a mute mode when a power supply is ON such that when the first detection unit detects no insertion or pulling out of the headphone plug, the mute mode is activated so as not to output an audio signal, when the first detection unit detects the insertion or pulling out of the headphone plug and the second detection unit does not detect that the volume position is set at a mute position, the mute mode is maintained, and when the first detection unit detects the insertion or pulling out of the headphone plug and the second detection unit detects that the volume position is set at the mute position, the mute mode is canceled.

8. The device according to claim 7 wherein the control unit comprises a logic gate that
   receives inputs of
      a binary detection signal from the first detection unit in accordance with whether the headphone plug is inserted or pulled out;
      a binary detection signal from the second detection unit in accordance with the volume position; and
      a binary detection signal from a power supply circuit in accordance with whether the power supply is ON or OFF, and
   generates and outputs a control signal to switch between a mute mode activation and a mute mode cancellation based on a logical operation.

9. The device according to claim 7 wherein the control unit comprises:
   a first logic gate to which a HIGH/LOW binary detection signal is input from the second detection unit in accordance with whether or not the volume position is set at the mute position or near the mute position, and
   a second logic gate that
      receives inputs of an output signal from the first logic gate; a HIGH/LOW binary detection signal from the first detection unit in accordance with whether the headphone plug is inserted or pulled out; a HIGH/LOW binary detection signal from a power supply circuit in accordance with whether the power supply is ON or OFF,
      generates and outputs a HIGH/LOW binary control signal indicating whether a mute mode is to be activated or canceled based on a logical operation, and
      supplies a portion of the generated output to the first logic gate as an input signal.

* * * * *